United States Patent
Hoogendam et al.

(10) Patent No.: US 8,760,621 B2
(45) Date of Patent: Jun. 24, 2014

(54) LITHOGRAPHIC APPARATUS AND METHOD

(75) Inventors: Christiaan Alexander Hoogendam, Westerhoven (NL); Franciscus Johannes Joseph Janssen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1073 days.

(21) Appl. No.: 11/716,670

(22) Filed: Mar. 12, 2007

(65) Prior Publication Data

US 2008/0225244 A1 Sep. 18, 2008

(51) Int. Cl.
*G03B 27/42* (2006.01)

(52) U.S. Cl.
USPC .................................. 355/53; 355/30; 355/72

(58) Field of Classification Search
CPC . G03F 7/707; G03F 7/70341; H01L 21/6838; H01L 21/6875
USPC ............................................... 355/30, 53, 72
See application file for complete search history.

(56) References Cited

U.S. PATENT DOCUMENTS

| | | | |
|---|---|---|---|
| 5,220,171 A | 6/1993 | Hara et al. | |
| 5,738,165 A | 4/1998 | Imai | |
| 6,019,164 A * | 2/2000 | Getchel et al. | 165/80.1 |
| 6,073,681 A | 6/2000 | Getchel et al. | |
| 6,215,642 B1 | 4/2001 | Sogard | |
| 6,540,014 B2 | 4/2003 | Getchel et al. | |
| 7,199,858 B2 | 4/2007 | Lof et al. | |
| 2004/0160582 A1* | 8/2004 | Lof et al. | 355/30 |
| 2004/0200226 A1 | 10/2004 | Hara | |
| 2005/0018167 A1* | 1/2005 | Maria Hennus et al. | 355/72 |
| 2005/0105070 A1* | 5/2005 | Bartray et al. | 355/53 |
| 2006/0102277 A1* | 5/2006 | Maria Zaal et al. | 156/290 |
| 2007/0153244 A1* | 7/2007 | Maria Zaal et al. | 355/30 |

FOREIGN PATENT DOCUMENTS

| | | |
|---|---|---|
| EP | 1 548 503 A2 | 6/2005 |
| EP | 1 650 604 A2 | 4/2006 |
| EP | 1 653 283 A2 | 5/2006 |
| JP | 07-142555 A | 6/1995 |
| JP | 2002-500438 | 1/2002 |
| JP | 2003-282685 A | 10/2003 |
| JP | 2006148101 | 6/2006 |

(Continued)

OTHER PUBLICATIONS

Singapore Search Report and Written Opinion for Singapore Application/Patent No. 200801816-0 dated Jul. 15, 2009.

(Continued)

*Primary Examiner* — Steven H Whitesell Gordon
*Assistant Examiner* — Mesfin T Asfaw
(74) *Attorney, Agent, or Firm* — Pillsbury Winthrop Shaw Pittman LLP

(57) ABSTRACT

A lithographic apparatus includes an illumination system constructed and arranged to condition a beam of radiation, and a support structure constructed and arranged to support a patterning device. The patterning device is configured to impart the beam of radiation with a pattern in its cross-section. The apparatus also includes a substrate table constructed and arranged to hold a substrate. The substrate table includes a substrate support plate that is in thermal contact with a thermal conditioning plate. The apparatus further includes a projection system constructed and arranged to project the patterned beam of radiation onto a target portion of the substrate.

22 Claims, 2 Drawing Sheets

(56) References Cited

FOREIGN PATENT DOCUMENTS

| JP | 2006-310374 A | 11/2006 |
|----|---------------|---------|
| TW | I251127 | 3/2006 |
| WO | WO 97/14077 A1 | 4/1997 |
| WO | 99/34412 | 7/1999 |

OTHER PUBLICATIONS

Notification of Reason(s) for Refusal dated Dec. 10, 2009 for Korean Patent Application No. 10-2008-0020858.
European Search Report Application No. 08250736.9-2222/1970764 Dated: Jun. 9, 2010.
Japanese Office Action dated Oct. 12, 2010 in related Japanese patent application No. 2008-056277.

* cited by examiner

LITHOGRAPHIC APPARATUS AND METHOD

FIELD

The present invention relates to a lithographic apparatus and a method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

Wires have conventionally been used to connect an IC to a board but this method is increasingly being replaced with a method referred to as "flip-chip bumping". In flip-chip bumping a pattern is imaged onto a thick layer of resist (i.e. thicker than a layer of resist used in conventional lithography) which is provided on the substrate. The resist is developed and processed such that recesses are formed at predefined locations and solder is then electroplated in the recesses. The resist is then removed leaving solder "bumps" projecting upwards from the uppermost surface of the substrate. In general, the resolution of the lithographic apparatus may be low, since the accuracy with which the solder bumps need to be located is typically around 1 micron (this is a significantly lower accuracy than the accuracy of tens of nanometers that is provided by high resolution lithographic apparatus).

Processes, such as flip-chip bumping, in which thicker layers of resist are patterned typically employ higher doses of radiation to produce the desired pattern. However, increasing the dose of radiation can lead to increased heating of the resist, substrate and/or substrate support table. For example, the temperature of the substrate in the vicinity of the exposed resist can rise excessively and cause local slippage or expansion of the substrate. Moreover, exposing larger areas of the substrate, or indeed the whole substrate, with increased doses of radiation can increase the overall average temperature of the substrate beyond acceptable limits and result in global slippage or expansion of the substrate and possibly large uncorrectable pattern overlay errors.

A method designed to address undesirable heating of a substrate is to immerse the substrate in a "cooling-" or "conditioning fluid" during exposure such that excessive levels of heat generated in the substrate can dissipate to the surrounding fluid. A problem with this method is that it may require significant modifications to conventional lithographic apparatus, which are both costly and time consuming. A further method intended to alleviate problems associated with excessive heating of a substrate is to provide the substrate support table with integral "cooling-" or "conditioning elements" which maintain the substrate to within a desired temperature range during exposure. In this way, excessive heat generated in the substrate is transferred away from the substrate. Typical conditioning elements comprise a series of channels formed in the support table through which a cooling fluid, such as water, is passed continuously during exposure. Problems associated with this method are that it again may require significant modifications to conventional lithographic apparatus, particularly the substrate support table, and that it is complicated and expensive to design and manufacture the support table so as to be watertight and possess the required flatness.

It is desirable to provide, for example, lithographic apparatus and a method which obviate or mitigate one or more of the problems of the prior art, whether identified herein or elsewhere.

SUMMARY

According to an aspect of the invention, there is provided a lithographic apparatus that includes an illumination system constructed and arranged to condition a beam of radiation, and a support structure constructed and arranged to support a patterning device. The patterning device is configured to impart the beam of radiation with a pattern in its cross-section. The apparatus also includes a substrate table constructed and arranged to hold a substrate. The substrate table includes a substrate support plate that is in thermal contact with a thermal conditioning plate. The apparatus further includes a projection system constructed and arranged to project the patterned beam of radiation onto a target portion of the substrate.

According to a further aspect of the invention, there is provided a lithographic substrate support table that includes a substrate support plate that is in thermal contact with a thermal conditioning plate.

According to another aspect of the invention, there is provided a lithographic method that includes projecting a beam of radiation beam onto a target portion of a substrate, and supporting the substrate on a substrate support table that comprises a substrate support plate. The substrate support plate is in thermal contact with a thermal conditioning plate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
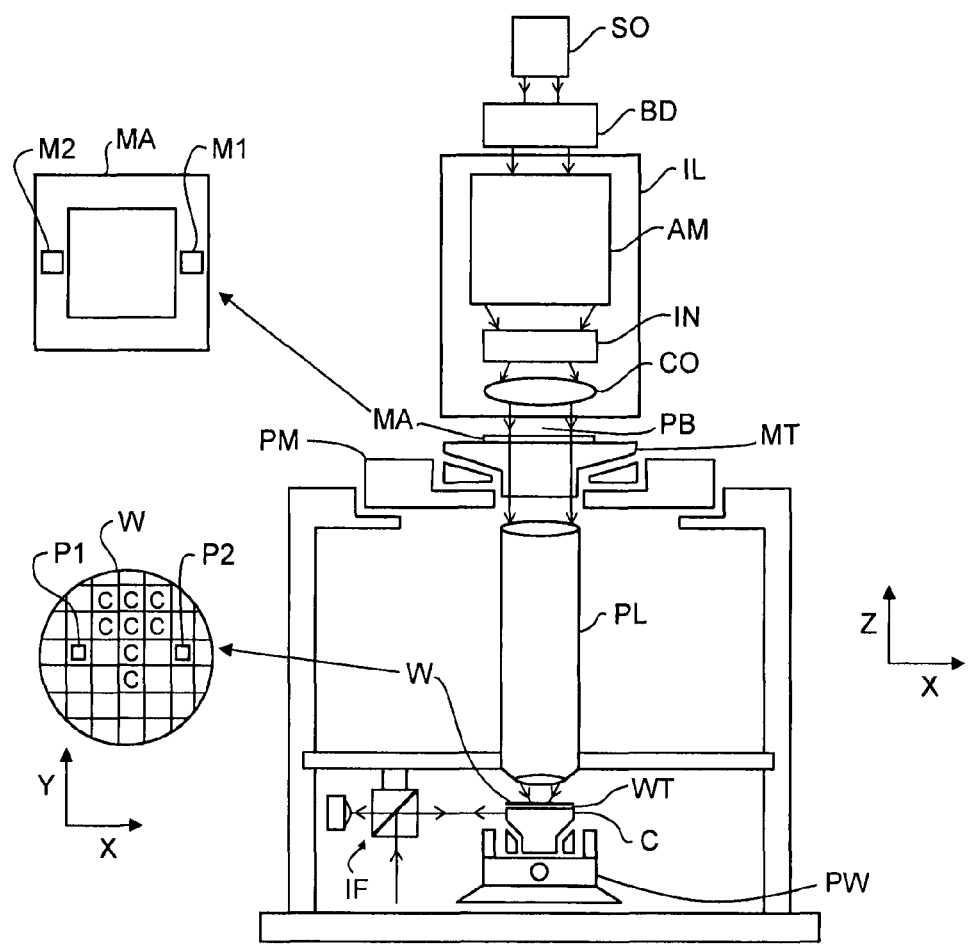
FIG. 1 depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 436, 405, 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

FIG. 1 schematically depicts a lithographic apparatus according to a particular embodiment of the invention. The apparatus comprises: an illumination system (illuminator) IL to condition a beam PB of radiation (e.g. UV radiation); a support structure (e.g. a support structure) MT to support a patterning device (e.g. a mask) MA and connected to first positioning device PM to accurately position the patterning device with respect to item PL; a chuck CH incorporating i) a wafer table/substrate support table WT for holding a substrate (e.g. a resist-coated wafer) W, and ii) a mirrorblock connected to a second positioning device PW for accurately positioning the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross-section.

The radiation beam PB is incident on the patterning device (e.g. mask) MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
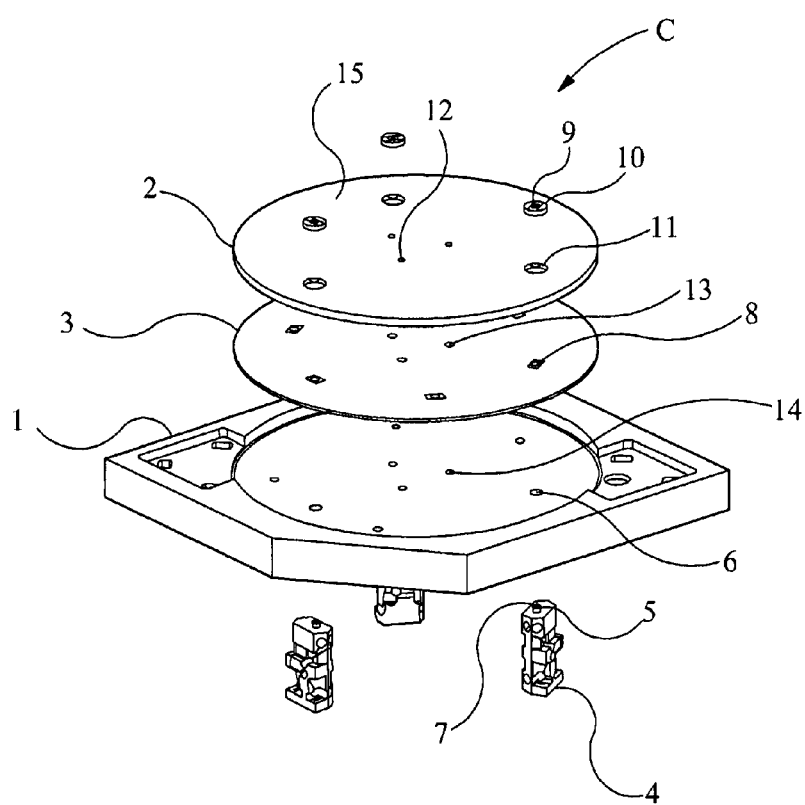
FIG. 2 depicts a more detailed illustration of components of the lithographic apparatus of FIG. 1.

FIG. 2 schematically represents a preferred non-limiting embodiment of the wafer table WT forming part of the lithographic apparatus depicted in FIG. 1. The chuck CH depicted in FIG. 2 comprises a mirrorblock 1, which supports a substrate support plate 2 with a thermal conditioning plate 3 interposed between the mirrorblock 1 and the substrate support plate 2. The thermal conditioning plate 3 is provided to maintain the temperature of the substrate support plate 2 to within a predetermined temperature range of around 0 to 1.5° C. of a machine temperature setpoint being used for a particular operation (typically, the set point is around 21.5 to 22.0° C.), and thereby limit undesirable increases in the temperature of a substrate (e.g. substrate W of FIG. 1; not shown in FIG. 2) supported on the plate 2. Such temperature rises can, for example, result from exposure to the higher doses of radiation employed in processes, such as flip-chip bumping, in which thicker layers of resist are patterned. The thermal conditioning plate 3 comprises a thermal conditioning element in the form of a channel (not shown) through which, in use, a conditioning fluid, such as cooling water, is passed. The water is preferably kept at approximately the same temperature as the setpoint temperature of the machine. A flow rate for the water of approximately 0.5 to 3.0 l/min is preferred.

While a conventional chuck incorporating a conditioning element consists of a mirrorblock and a substrate support table incorporating an integral conditioning element, the chuck CH of the present invention incorporates an additional component: the thermal conditioning plate 3, in which the conditioning element is provided. By providing two separate plates that are in thermal contact in this way, the substrate support plate 2 does not have to be modified to incorporate the conditioning element. The conditioning element can instead be provided much less expensively and easily in the conditioning plate 3, which can be formed from a material which is more amenable to processing to provide the conditioning element than the types of material conventionally used for substrate support tables. Moreover, the structural integrity of the material used to form the substrate support plate 2 is not jeopardized by processing to incorporate the conditioning element. Furthermore, where problems arise in the conditioning element, such as leaks or fissures, only the thermal conditioning plate 3 would need to be repaired or replaced, and not the substrate support plate 2. Additionally, by providing the thermal conditioning plate 3 in between the mirrorblock 1 and substrate support plate 2, the mirrorblock 1 is used to directly support the thermal conditioning plate 3, interferometer mirrors and imaging sensors but not the substrate support plate 2. Consequently, the mirrorblock 1 does not need to be provided with such a precisely engineered flat surface to support the substrate support plate 2, and so the cost and complexity of manufacturing the mirrorblock 1 may be reduced.

The mirrorblock 1 is supported on three mirrorblock support blocks 4. Each support block 4 defines a hollow cylindrical projection 5 for location in a complementary cylindrical recess 6 defined by the mirrorblock 1. The substrate support plate 2, thermal conditioning plate 3 and mirrorblock 1 are connected to one another by a series of pins (not shown). The hollow cylindrical projection 5 on each support block 4 defines a central aperture 7 for receipt of a pin. Each pin passes from the aperture 7, via an aperture 8 defined in the thermal conditioning plate 3, to an aperture 9 defined by a flexible mounting hinge 10, which is itself received in a complementary recess 11 defined by the substrate support plate 2. The pins which pass through the apertures defined by the mirrorblock 1 and the two plates 2, 3 are arranged so as to be a sufficient distance from the target portion of the substrate to permit unrestricted local deformation of the substrate in the vicinity of the target portion during irradiation by the radiation beam. In this way, the substrate support plate 2 and thermal conditioning plate 3 are flexibly connected so as to be "freely expanding", i.e. any localized movement and/or deformation by expansion and/or contraction of the support plate 2, caused by the heating effect of the radiation beam, is unrestricted by the pins which hold the mirrorblock 1 and plates 2, 3 together. Allowing a limited degree of relative movement between the plates 2, 3 may be advantageous in certain applications, such as flip-chip bumping, since it tolerates minor structural deformations in the substrate resulting from the increased heating effect of higher doses of radiation. It will be appreciated that such minor structural deformations in the substrate are not problematic in applications, such as flip-chip bumping, because the patterning resolution needed in these applications is lower than in many other lithographic processes.

The exemplary embodiment of the present invention depicted in FIG. 2 further illustrates three sets of holes 12, 13, 14 defined by the substrate support plate 2, thermal conditioning plate 3 and mirrorblock 1 respectively. The holes 12, 13, 14 are configured for receipt of E-pins (not shown) to facilitate lifting of the wafer W after exposure.

The substrate support plate 2 and thermal conditioning plate 3 are arranged in the embodiment depicted in FIG. 2 such that they are separated by an air gap where the average separation between their facing surfaces is approximately 0.05 mm. In this embodiment, the heat conductance between the substrate support plate 2 and the thermal conditioning plate 3 will be approximately 0.025 W/mK.

In alternative embodiments of the apparatus depicted in FIG. 2, any appropriate number and arrangement of pins and/or support blocks can be used to suit a particular application. The plates 2, 3 may be separated by any appropriate distance and may or may not include an air gap. It is preferred that the distance separating the facing surfaces of the plates 2, 3 is in the range of around 0 to 2 mm. In one preferred embodiment, the plates 2, 3 are separated by an air gap of 0.1 mm, which provides a heat conductance of around 0.07 W/mK between the plates 2, 3. In a further alternative embodiment, the substrate support plate 2 is connected to the thermal conditioning plate 3 by a layer of a suitable adhesive, such as a thermal paste or a good heat conductive flexible glue. The adhesive can be selected so as to provide the required thermal conductivity between the support plate 2 and conditioning plate 3, and/or to provide the desired degree of flexibility between the plates 2, 3. Where a thermal paste is employed the separation of the plates 2, 3 may be, but is not necessarily, higher than where the plates 2, 3 are separated by an air gap. For example, a pair of plates 2, 3 connected by an appropriate thermal paste may be separated by up to around 1 mm, which could provide a heat conductance of approximately 0.5 W/mK. The precise heat conductance exhibited will depend upon many different factors, including the separation of the plates 2, 3 and the medium interposed between the plates 2, 3. It is preferred that the heat conductance between the plates 2, 3 is up to around 2.5 W/mK.

The substrate support plate 2 further comprises a substrate support surface 15, which defines a plurality of surface deformations, preferably burls, (not shown) which are arranged to contact and support a substrate (not shown) located on the support plate 2. In a preferred embodiment of the apparatus shown in FIG. 2, the surface deformations are arranged so as to contact up to approximately 20% of the area of a surface of the substrate which contacts the substrate support surface. It is preferred that the contact area is equal to or greater than about 10% of the substrate area. In further preferred alternative embodiments, the contact area between the surface deformations and the surface of the substrate is around 5 to 20%, and more preferably 10 to 20%, of the area of the substrate surface. It is generally preferred to employ larger contact areas than in prior art systems to ensure a sufficiently high rate of heat transfer from the substrate when required.

The substrate support plate 2 depicted in FIG. 2 is relatively thick when compared to many conventional support tables. This is to provide the support plate 2 with a relatively large thermal mass to prevent undesirably high global temperature rises, which could otherwise cause large global thermal drift during exposure of a substrate to radiation. The support plate 2 depicted in FIG. 2 has a thickness of approximately 5 mm. In further preferred embodiments, the support table 2 has a thickness greater than approximately 5 mm. Preferably, the support table 2 has a thickness in the range of around 5 to 20 mm, more preferably in the range around 5 to 10 mm.

The substrate support plate 2 comprises a material having a high thermal conductivity. It is preferred that the material has a thermal conductivity of equal to or greater than around 50 W/mK, more preferably a thermal conductivity in the range around 50 to 250 W/mK, and most preferably around 50 to 150 W/mK. This is desirable since it should facilitate the efficient dissipation of heat from the substrate (not shown) to the thermal conditioning plate 3. The substrate support plate 2 of FIG. 2 comprises siliconized silicon carbide (SiSiC). In alternative preferred embodiments other materials, such as silicon carbide (SiC) or the like may be used.

The thermal conditioning plate 3 shown schematically in FIG. 2 comprises a stainless steel. In other preferred embodiments, the thermal conditioning plate may comprise one or more metals (e.g. steel, titanium, aluminum or the like), non-metals and/or ceramic materials separately or in any desirable combination, mixture or alloy.

It will be appreciated that an important function of the conditioning plate 3 incorporating conditioning elements is to maintain the chuck CH and thereby the substrate/wafer W to within an acceptable temperature range under typical processing conditions. Furthermore, it will be understood that an important reason for using a substrate/wafer W contact area which is preferably higher than normal and/or a substrate support plate 2 which is preferably thicker than normal is to maintain the substrate/wafer W to within an acceptable temperature range during exposure.

While specific embodiments of the invention have been described above, it will be appreciated that the invention may be practiced otherwise than as described. The description is not intended to limit the invention. The invention is defined by the claims that follow.

What is claimed is:

1. A lithographic apparatus comprising:
   a substrate table constructed and arranged to hold a substrate, the substrate table having a support block having a recess therein and a thermal conditioning plate on the support block and in the recess, the thermal conditioning plate having thereon, in thermal contact, a substrate support plate in the recess, wherein the support block, the thermal conditioning plate, and the substrate support plate are separate from each other and not permanently attached to each other, the substrate support plate comprising a material having a thermal conductivity of equal to or greater than approximately 50 W/mK and a substrate support surface that defines a plurality of surface deformations arranged to contact and support the substrate, wherein the surface deformations are arranged to contact more than or equal to 5% but less than or equal to approximately 20% of the area of a surface of the substrate that is arranged to contact the substrate support surface; and
   a projection system constructed and arranged to project a patterned beam of radiation onto a target portion of the substrate.

2. The lithographic apparatus of claim 1, wherein the surface deformations are arranged to contact equal to or greater than approximately 10% of the area of a surface of the substrate that is arranged to contact the substrate support surface.

3. The lithographic apparatus of claim 1, wherein the surface deformations are burls.

4. The lithographic apparatus of claim 1, wherein the substrate support plate has a thickness of at least approximately 5 mm.

5. The lithographic apparatus of claim 1, wherein the substrate support plate comprises a material selected from the group consisting of silicon carbide, siliconized silicon carbide and the like.

6. The lithographic apparatus of claim 1, wherein the thermal conditioning plate comprises a material selected from the group consisting of a metal, a non-metal, a ceramic, and alloys and mixtures thereof.

7. The lithographic apparatus of claim 1, wherein the thermal conditioning plate comprises a thermal conditioning element arranged to maintain a temperature of the substrate support plate to within a predetermined temperature range.

8. The lithographic apparatus of claim 7, wherein the thermal conditioning element comprises a channel arranged for the passage of a thermal conditioning fluid.

9. The lithographic apparatus of claim 8, wherein the thermal conditioning fluid comprises water.

10. The lithographic apparatus of claim 1, wherein the substrate support plate is flexibly connected to the thermal conditioning plate.

11. The lithographic apparatus of claim 1, wherein the substrate support plate is connected to the thermal conditioning plate by a layer of adhesive.

12. The lithographic apparatus of claim 1, wherein the substrate support plate is connected to the thermal conditioning plate by one or more flexible connecting blocks.

13. The lithographic apparatus of claim 1, wherein the substrate support plate is connected to the thermal conditioning plate by one or more connecting blocks which are arranged so as to be a sufficient distance from the target portion of the substrate to permit unrestricted local deformation of the substrate in the vicinity of the target portion during irradiation by said radiation beam.

14. The lithographic apparatus of claim 1, wherein the average separation between facing surfaces of the substrate support plate and the thermal conditioning plate is approximately 0.05 mm.

15. The lithographic apparatus of claim 1, wherein the substrate support plate and thermal conditioning plate are arranged such that the thermal conduction coefficient between the plates is approximately 0.07 W/mK over a distance of approximately 100 µm.

16. The lithographic apparatus of claim 1, wherein the support block comprises a mirrorblock upon which the thermal conditioning plate is supported.

17. The lithographic apparatus of claim 16, wherein the mirrorblock is connected to the substrate support plate and/or the thermal conditioning plate by at least one mounting block.

18. A lithographic substrate support table constructed and arranged to hold a lithographic substrate, the support table having a support block having a recess therein and a thermal conditioning plate on the support block and in the recess, the thermal conditioning plate having thereon, in thermal contact, a substrate support plate in the recess wherein the support block, the thermal conditioning plate, and the substrate support plate are separate from each other, the substrate support plate comprising a material having a thermal conductivity of equal to or greater than approximately 50 W/mK and a substrate support surface that defines a plurality of surface deformations arranged to contact and support the lithographic substrate, wherein the surface deformations are arranged to contact more than or equal to 5% but less than or equal to approximately 20% of the area of a surface of the lithographic substrate that is arranged to contact the substrate support surface.

19. The lithographic substrate support table of claim 18, wherein the surface deformations are arranged to contact equal to or greater than approximately 10% of the area of a surface of the substrate that is arranged to contact the substrate support surface.

20. The lithographic substrate support table of claim 18, wherein the substrate support plate has a thickness of at least approximately 5 mm.

21. A lithographic method comprising:
projecting a beam of radiation beam onto a target portion of a substrate; and
supporting the substrate on a substrate support table that has a support block having a recess therein and a thermal conditioning plate on the support block and in the recess, the thermal conditioning plate having thereon, in thermal contact, a substrate support plate in the recess, wherein the support block, the thermal conditioning plate, and the substrate support plate are separate from each other and not permanently attached to each other, the substrate support plate comprising a material having a thermal conductivity of equal to or greater than approximately 50 W/mK and substrate support surface that defines a plurality of surface deformations arranged to contact and support the substrate, wherein the surface deformations are arranged to contact more than or equal to 5% but less than or equal to approximately 20% of the area of a surface of the substrate that is arranged to contact the substrate support surface.

22. The lithographic method of claim 21, wherein the method further comprises patterning the beam of radiation with a pattern in its cross-section; and projecting the patterned beam of radiation onto the target portion of the lithographic substrate.

* * * * *